US010836487B2

(12) United States Patent
Sokolowski

(10) Patent No.: US 10,836,487 B2
(45) Date of Patent: Nov. 17, 2020

(54) SYSTEM FOR UNASSISTED SKY DIVING

(71) Applicant: Category, LLC, Largo, FL (US)

(72) Inventor: Maurycy Sokolowski, Largo, FL (US)

(73) Assignee: Category, LLC, Largo, FL (US)

( * ) Notice: Subject to any disclaimer, the term of this patent is extended or adjusted under 35 U.S.C. 154(b) by 122 days.

(21) Appl. No.: 16/199,762

(22) Filed: Nov. 26, 2018

(65) Prior Publication Data

US 2020/0164979 A1 May 28, 2020

(51) Int. Cl.
| | | |
|---|---|---|
| A63G 31/00 | (2006.01) |
| B64C 39/02 | (2006.01) |
| B64D 17/30 | (2006.01) |
| G01R 31/382 | (2019.01) |
| G01C 5/00 | (2006.01) |

(52) U.S. Cl.
CPC ............ *B64C 39/024* (2013.01); *A63G 31/00* (2013.01); *B64D 17/30* (2013.01); *G01C 5/005* (2013.01); *G01R 31/382* (2019.01); *A63G 2031/005* (2013.01); *B64C 2201/127* (2013.01); *B64C 2201/146* (2013.01)

(58) Field of Classification Search
CPC ................ A63G 2031/005; B64C 39/024
See application file for complete search history.

(56) References Cited

U.S. PATENT DOCUMENTS

| | | | | |
|---|---|---|---|---|
| 3,152,248 | A * | 10/1964 | Deschamps .......... | G05D 1/0858 701/16 |
| 10,029,786 | B1 * | 7/2018 | Adams .................. | B64D 17/30 |
| 2015/0284065 | A1 | 10/2015 | MacCallum et al. | |
| 2016/0257401 | A1 * | 9/2016 | Buchmueller ....... | G01C 21/343 |
| 2017/0102715 | A1 * | 4/2017 | Shi ........................ | G05D 1/0094 |
| 2017/0129603 | A1 * | 5/2017 | Raptopoulos ........ | G05D 1/0676 |
| 2017/0166309 | A1 | 6/2017 | Sekiya | |
| 2017/0361929 | A1 | 12/2017 | Demonfort | |
| 2018/0173220 | A1 * | 6/2018 | Wang ...................... | G06F 3/017 |
| 2018/0259953 | A1 * | 9/2018 | Park ..................... | G05D 1/0669 |
| 2019/0092468 | A1 * | 3/2019 | Deutsch ................ | B64C 39/024 |
| 2019/0210735 | A1 * | 7/2019 | Shih ....................... | B64D 17/62 |

FOREIGN PATENT DOCUMENTS

WO    2018100222    6/2018

OTHER PUBLICATIONS

Hardy, Rich; "Drone skydiving: Would you take the plunge?", New Atlas; May 15, 2017; <https://newatlas.com/skydiving-drone-video/49519/> (Year: 2017).*

Aerones, "World's first drone jump" https://www.youtube.com/watch?v=EOPZhRJtz9w, May 12, 2017.

* cited by examiner

*Primary Examiner* — Anshul Sood

(74) *Attorney, Agent, or Firm* — Larson & Larson, P.A.; Frank Liebenow; Justin P. Miller

(57) ABSTRACT

A drone is operated by a sky diver. The drone is interfaced to a parachute pack worn by the sky diver. The sky diver has a device (e.g. smartphone, smartwatch) that communicates with the drone to initiate launch/lift and to release the sky diver. In some embodiments, after the sky diver is released, the drone maneuvers around the sky diver to capture pictures/video of the sky diver. In some embodiments, safety features are included to assure the drone has sufficient battery power to achieve a safe jump altitude above ground level and to assure the release is not made until the drone achieves that safe jump altitude.

20 Claims, 13 Drawing Sheets

SYSTEM FOR UNASSISTED SKY DIVING

FIELD

This invention relates to the field of aviation and more particularly to a system for unassisted sky diving.

BACKGROUND

Many people enjoy recreational or professional sky diving. Recreational sky diving is typically for enjoyment and performed by jumping out of a smaller propeller-driven (slow-speed) airplane. Professional sky diving is usually for a specific purpose such as accessing a location that is difficult to reach by land/water craft, for example, for military reasons, firefighting, etc.

Before a person is able to skydive solo (without another, experienced sky diver), that person must be trained/certified, often using written training, simulation training, then tandem sky dives in which they are tethered to an experienced sky diver. Once certified, a person is capable (and allowed) to jump from an airplane at the requisite altitude without the assistance of another person, often called a solo sky dive.

For most people, the process of recreational sky diving includes arranging for an airplane and pilot at a considerable expense. Then, after payment, the pilot and sky diver takes off from a small airport and flies to the drop zone, where the sky diver exits the airplane with their parachute and free falls until the sky diver deploys their parachute, landing at the drop zone. The sky diver then needs to be transported from the drop zone to wherever they started (e.g. the small airport.

During the certification process, the sky diver must make many sky dives, either in tandem with a trainer or solo with a trainer diving at the same time. As the time and cost required for a piloted airplane is high, the time required for such training/certification is high, both for recreational training and professional training. Further, the cost and time required to travel to a nearby airport, charter a pilot and plane, and provide transportation to/from the drop zone often makes sky diving a very expensive sport.

What is needed is a system whereby the cost and effort required for each sky dive is reduced.

SUMMARY

A drone operated by the sky diver is interfaced to a parachute pack worn by the sky diver. The sky diver has a device (e.g. smartphone, smartwatch) that communicates with the drone to initiate launch/lift and to release the sky diver. In some embodiments, after the sky diver is released, the drone maneuvers around the sky diver to capture pictures/video of the sky diver. In some embodiments, safety features are included to assure the drone has sufficient battery power to achieve a safe jump altitude above ground level and to assure the release is not made until the drone achieves that safe jump altitude.

In one embodiment, a system for unassisted sky diving is disclosed including a drone and a connector between the drone and a parachute pack. The parachute pack for containing a parachute and the parachute pack having a harness for attaching to a sky diver. There is a device for controlling the drone having a function for initiating a launch of the drone by the sky diver and a function for releasing the parachute pack from the drone at the connector.

In another embodiment, a method of unassisted sky diving is disclosed including donning a parachute pack by a sky diver and attaching the parachute pack to a drone. Next, controlling the drone to launch into air using by way of a device that is held or worn by the sky diver; thereby carrying the sky diver into the air. Next, controlling the drone to release the parachute pack and sky diver from the drone.

In another embodiment, a system for unassisted sky diving is disclosed including a drone. The drone includes a device for attaching and releasing to a parachute pack; a battery, a radio frequency transceiver, motors with blades operatively attached to each of the motors; a device for determining location; a device for measuring an altitude; and a processor. The processor is operatively coupled to the radio frequency transceiver, the motors, the device for determining the location; the device for measuring the altitude and to the battery. The parachute pack is for containing a parachute and has a harness holding a sky diver. There is a device for controlling the drone that is held or worn by the sky diver. The device for controlling the drone has a second radio frequency transceiver for communicating with the radio frequency transceiver of the drone. There is a function for sending a first signal from the second radio frequency transceiver to the radio frequency transceiver of the drone that is initiated by the sky diver. The first signal instructs the processor to read a ground level altitude from the device for measuring the altitude and then to enable the motors to lift the drone into air, carrying the sky diver. There is another function for sending a second signal from the second radio frequency transceiver to the radio frequency transceiver of the drone that is also initiated by the sky diver. The second signal instructs the processor to release the parachute pack and the sky diver from the drone at the device for attaching and releasing.

BRIEF DESCRIPTION OF THE DRAWINGS

The invention can be best understood by those having ordinary skill in the art by reference to the following detailed description when considered in conjunction with the accompanying drawings in which.

DETAILED DESCRIPTION

Figure 1:
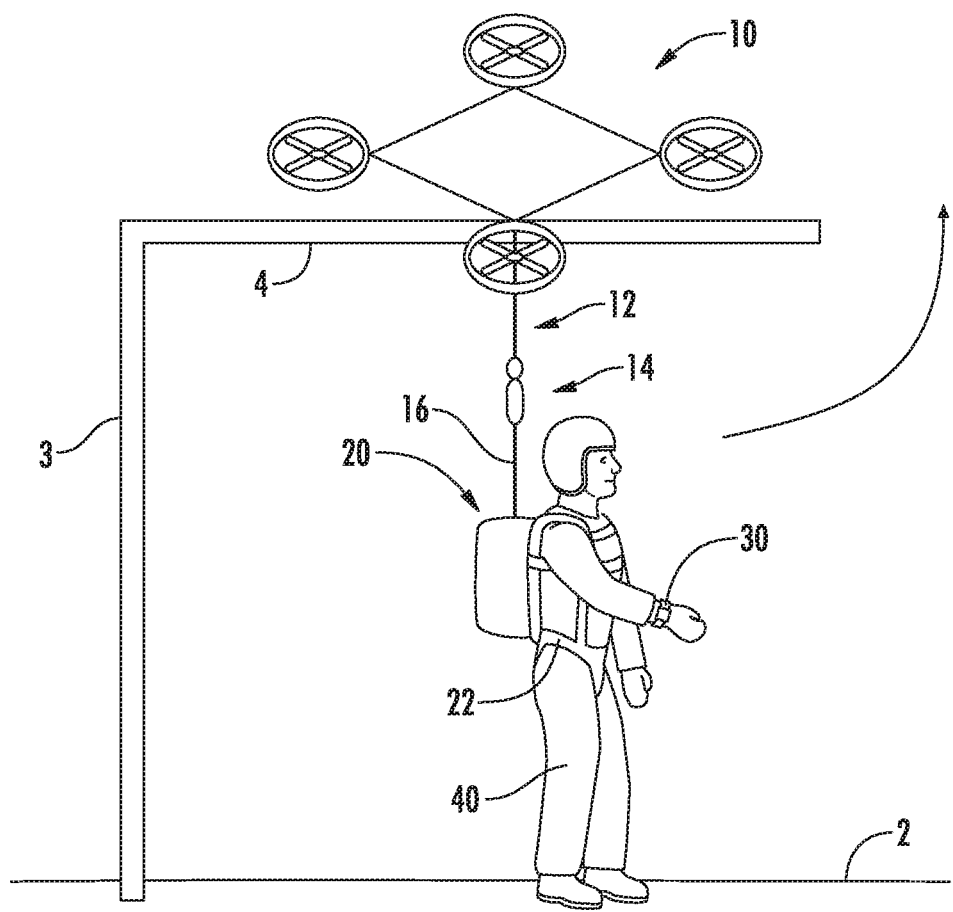
FIG. 1 illustrates a side view of a system for unassisted sky diving.

Reference will now be made in detail to the presently preferred embodiments of the invention, examples of which are illustrated in the accompanying drawings. Throughout the following detailed description, the same reference numerals refer to the same elements in all figures.

Referring to FIG. 1, a side view of a system for unassisted sky diving is shown. The system for unassisted sky diving provides a mechanism that enables a person to perform a sky dive without the assistance of others. In the past, in order to do such, one had to climb a high mountain and jump of a cliff, requiring huge time expenditures and being quite dangerous. Further, those living in areas without mountains cannot attain sufficient altitude for such sky diving (a minimum of around 1000 feet of altitude above a landing zone is generally required, mostly for safety reasons). Therefore, most sky divers must charter an airplane, travel to an airport, take off with a pilot, then travel to the jump zone in the airplane and exit the airplane at the requisite altitude (for example, 10,000 feet above ground level altitude 2). After landing, the sky diver must find way back to the airport or elsewhere for exit transportation.

Instead of requiring an airplane, pilot, and airfield, the present invention utilizes a drone 10 capable of lifting the sky diver 40 at least 1000 feet above ground level altitude 2, and, preferably, 10,000 feet above ground level altitude 2.

In such, the sky diver 40 pilots the drone using a device 30 (e.g. a smart watch or smartphone).

To begin, the sky diver 40 dons a parachute pack 20, held to the sky diver 40 by a harness 22, as known in the industry of sky diving. The drone 10 is then interfaced to the parachute pack 20 and/or harness 22 through a series of cables 12/16 and a connector 14 (e.g. a carabineer or electrically released connector). In the example shown in FIG. 1, the sky diver 40 stands beneath a platform 3/4 that supports the drone 10 just above the head of the sky diver 40, though there is no requirement for such a platform 3/4 as it is fully anticipated that, in some embodiments, the drone 10 is connected to the parachute pack 20 and/or harness 22 while the drone 10 is on the ground, or in other embodiments, the drone 10 hovers over the sky diver 40 while the sky diver 40 connects the parachute pack 20 and/or harness 22 to the drone 10.

In some embodiments, the connector 14 is a manual release device, requiring the sky diver 40 to initiate the release manually. In other embodiments, the connector 14 is an electrically operated release that is controlled by the drone 10 under remote control by the sky diver 40 through use of the device 30. As will be shown, by using a connector 14 that is electrically operated to release under control of the drone 10, several user friendly features and safety features are envisioned.

Figure 2:
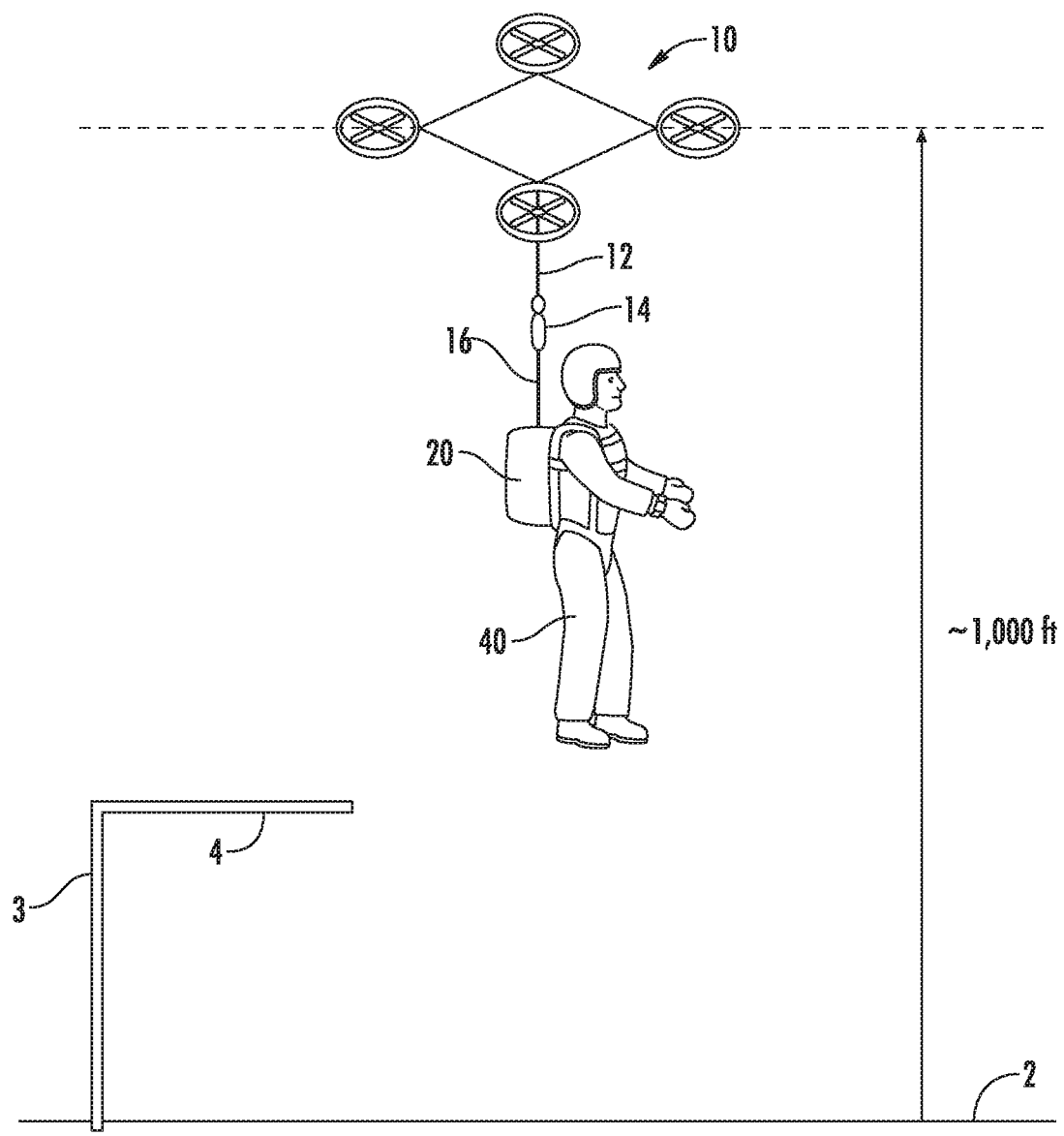
FIG. 2 illustrates the system for unassisted sky diving after launch.

Referring to FIG. 2, the system for unassisted sky diving is shown after launch. In this, drone 10 is interfaced to the parachute pack 20 and/or harness 22 of the sky diver 40 through a series of cables 12/16 and a connector 14 and the drone 10 has been instructed by the device 30 (e.g. smart watch or smartphone) to lift the sky diver 40, shown at a low altitude (e.g. less than 1000 feet).

In embodiments with connector 14 that is electrically operated to release under control of the drone 10, as a safety feature, release is inhibited as jumping from such low altitudes is often dangerous as there is insufficient time for proper opening of the parachute pack 20.

Figure 3:
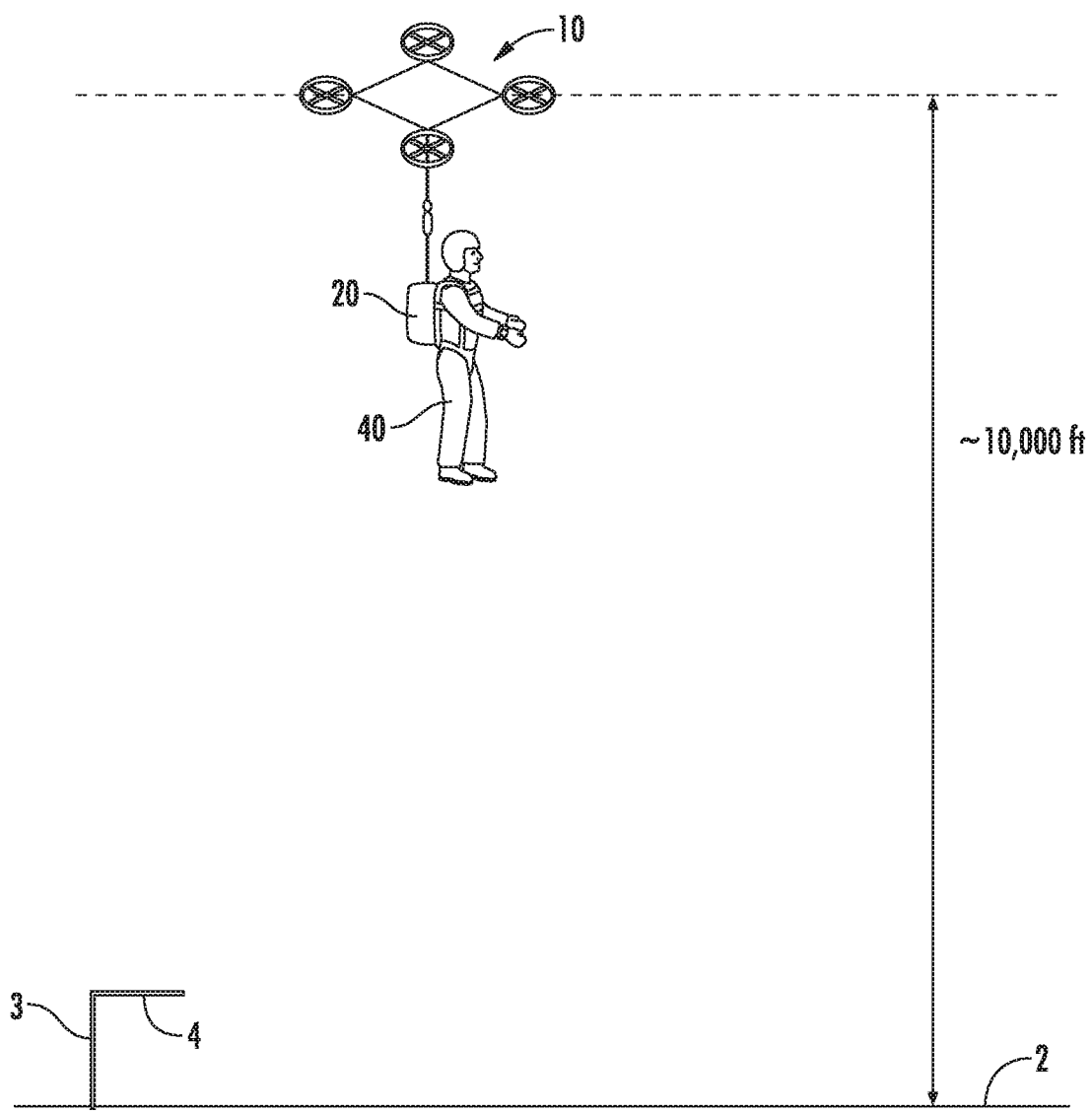
FIG. 3 illustrates the system for unassisted sky diving at an exemplary jump altitude.

Referring to FIG. 3, the system for unassisted sky diving is shown at an exemplary jump altitude. In this, the drone 10 and sky diver 40 has reached the desired altitude (e.g. 10,000 feet above ground level). At this point, the sky diver 40 either manually releases the connector 14 or the sky diver 40 initiates release with the use of the device 30 which communicates with the drone 10 to initiate release. In some embodiments with a connector 14 that is electrically controlled by the drone 10, the drone 10 is preprogrammed to release the sky diver 40 at a specific altitude (above ground level altitude 2).

In some embodiments, the jump altitude is negotiated based upon available battery power of the drone 10 (e.g. power level). In such, the drone 10 knows/learns the weight of the sky diver 40 and calculates how much battery power will be required to reach the desired altitude above ground level altitude 2 or a maximum attainable altitude of the drone 10 with the weight of the sky diver 40. In such, the drone 10 assesses available battery power to make sure sufficient battery power is available for reaching the desired altitude and for a safe return and smooth landing. If sufficient battery life is not available to reach the desired altitude, the drone 10 signals the device 30 of the sky diver 40 an altitude that will be safe, providing power for hovering at that altitude until release and power for returning to the platform 3/4 or the ground level altitude 2. If the drone 10 calculates that there is not sufficient battery power for the drone 10 and sky diver 40 to reach at least a safe diving altitude (e.g. 1000 feet above ground level altitude 2), the drone 10 inhibits take off and warns the sky diver 40 through the device 30 and/or other indicators on the drone 10 (e.g. blinking LEDs).

In some embodiments, if the sky diver 40 decides to abort the dive (e.g. unfavorable winds), the drone 10 assesses available battery power and, if sufficient battery power is available, the drone 10 returns the sky diver 40 to the ground level altitude 2. If there is insufficient battery power for a safe return, the drone 10 signals the sky diver 40 that a safe return is not possible and requires the sky diver 40 to initiate release or the drone 10 lowers the sky diver to a minimum safe altitude before releasing the connector 14 and, hence, the sky diver. This is a safety feature, as if there is insufficient battery power for a safe return, it will be possible that the drone 10 and sky diver 40 will only reach a lower altitude (above ground level altitude 2) and the drone 10 will stall, potentially at an altitude that is insufficient for safe deployment of the parachute 24 from the parachute pack 20 and high enough to inflict injury and/or death to the sky diver 40.

Figure 4:
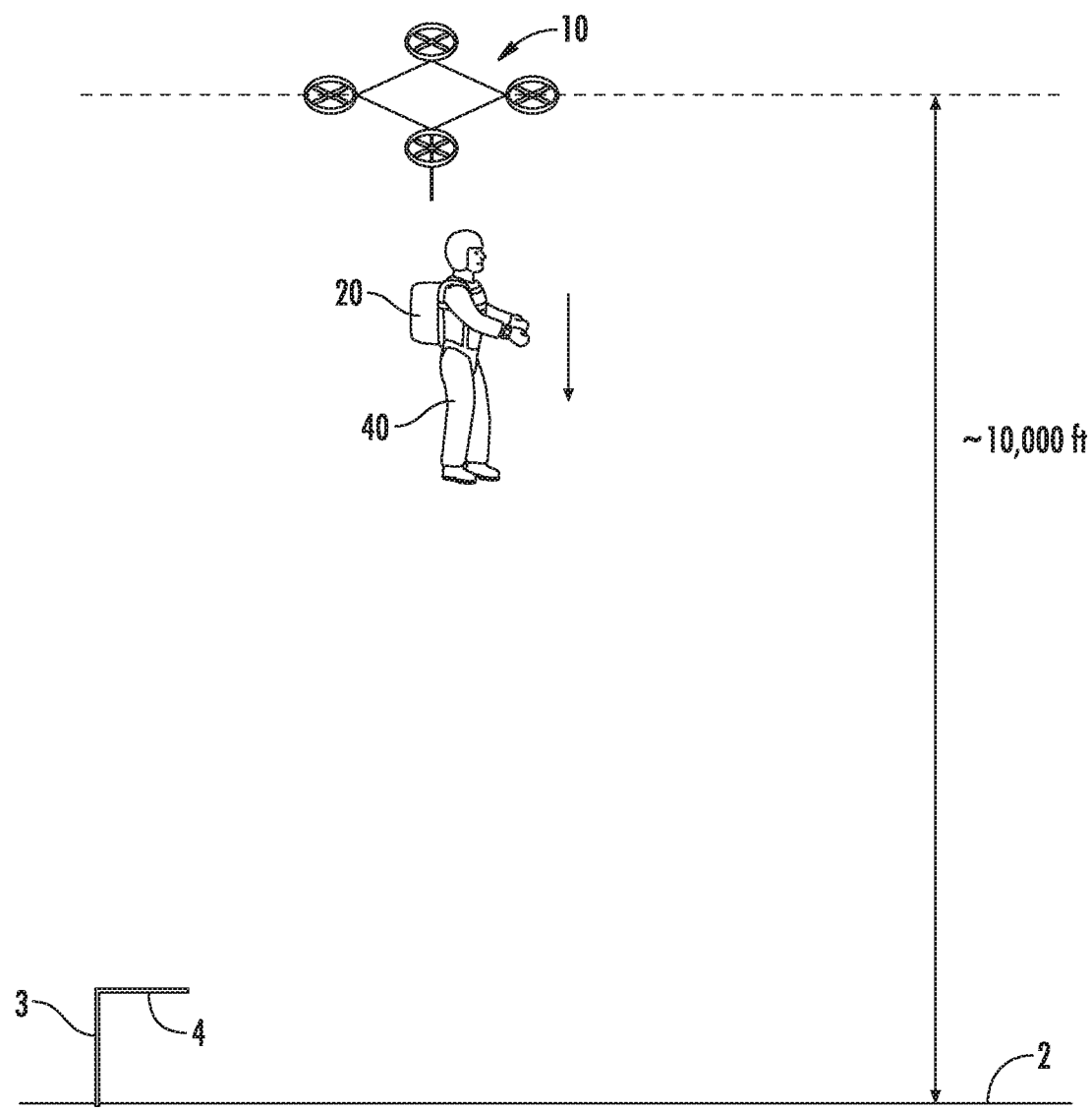
FIG. 4 illustrates the system for unassisted sky diving after release.

In any case, if the dive is not aborted, the sky diver 40 with parachute pack 20 is released from the drone 10 and begins the freefall phase of the jump as shown in FIG. 4.

Referring to FIG. 4, the system for unassisted sky diving is shown after release. The drone 10 is still above the sky diver 40 and the parachute 24 has not been deployed from the parachute pack 20, yet.

Figure 5:
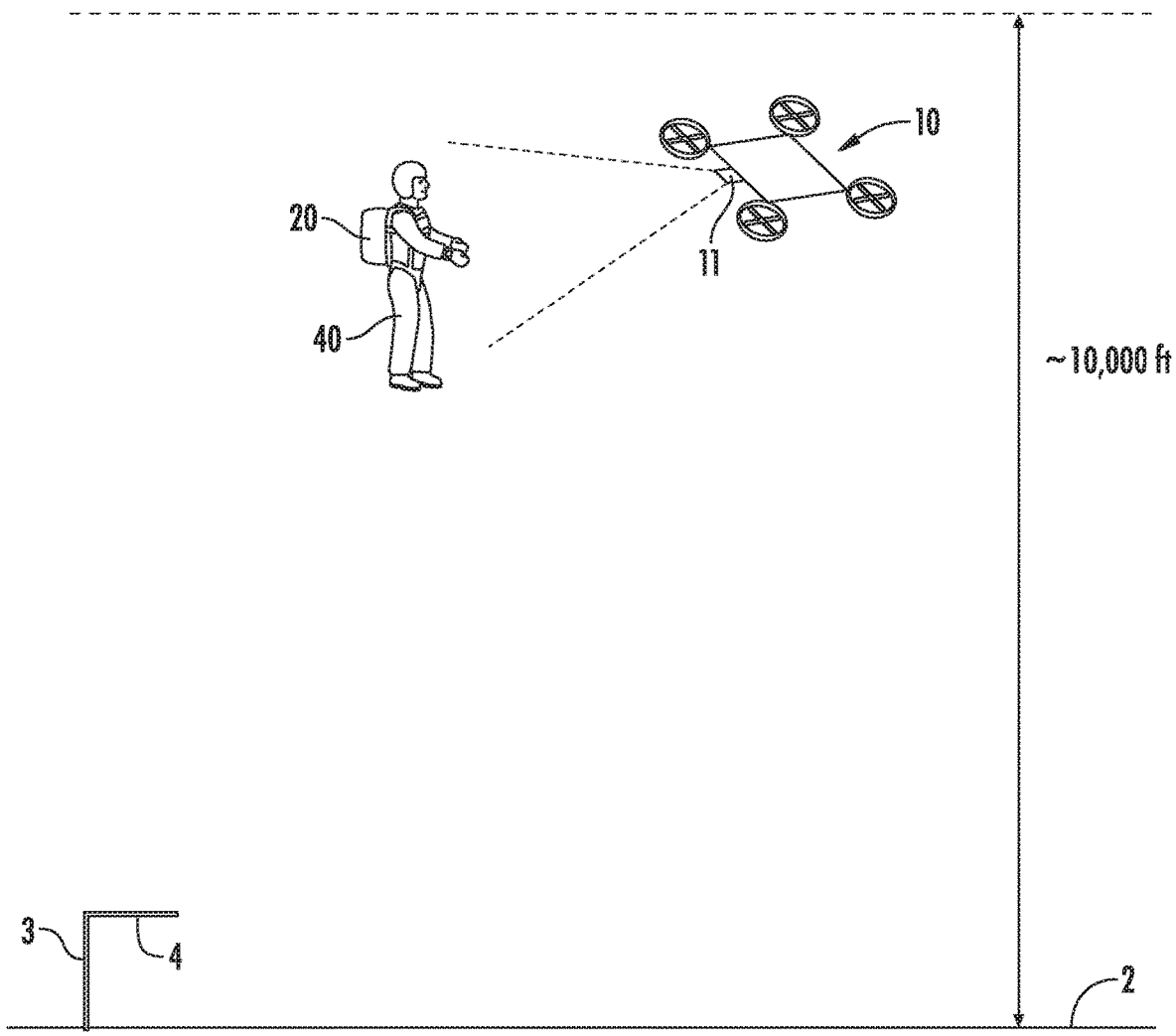
FIG. 5 illustrates the system for unassisted sky diving capturing images/video during a free-fall segment of the sky dive.
Figure 6:
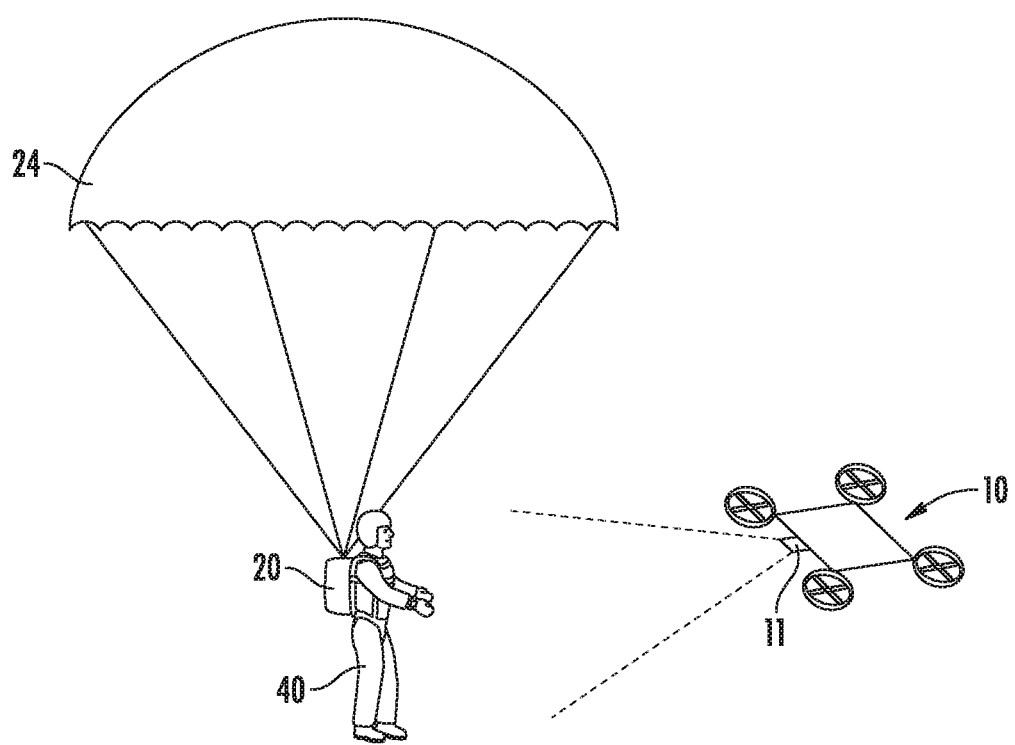
FIG. 6 illustrates the system for unassisted sky diving capturing images/video after opening of the parachute.
Figure 6:

Referring to FIGS. 5 and 6, the system for unassisted sky diving is shown capturing images/video during a free-fall segment of the sky dive (FIG. 5) and capturing images/video after opening of the parachute (FIG. 6). Once the sky diver 40 has been released from the drone 10, the drone 10 also makes the journey back to ground level altitude 2 (or to the platform 3/4). In a preferred embodiment, the drone 10 assesses available battery power to make sure sufficient battery power is available for a safe return and smooth landing. If there is sufficient battery power and the drone 10 is instructed or programmed to capture images/video, the drone 10 utilizes camera technology to recognize the sky diver 40 and/or parachute 24 and maneuvers around the sky diver 40 and parachute 24, capturing images and/or video. In a preferred embodiment, the drone 10 utilizes the drone camera 11 or other sensing mechanisms such as measuring a signal strength of a radio signal from the device 30 to determine a distance between the drone 10 and the sky diver 40. This is important as the drone must avoid the area above the sky diver 40 during freefall (FIGS. 4 and 5) so as not to get tangled in the parachute 24 after deployment of the parachute 24 (see FIG. 6) from the parachute pack 20.

In FIG. 6, the sky diver 40 has released their parachute 24 from the parachute pack 20 and is slowly returning to ground level altitude 2. Again, given sufficient battery power, the drone 10 continues capturing images and/or video, including the landing of the sky diver 40 and how well the sky diver 40 manages the parachute 22.

There are circumstances when the sky diver 40 cuts away the parachute 22 and then releases a reserve parachute (not shown for brevity and clarity), for example, when the parachute 22 gets tangled after opening. In the past, many expensive parachutes 22 drift away and get lost in a forest or marsh. As understandable, the sky diver 40 is consumed with making a safe landing and not as concerned with noting where the parachute 22 has drifted. In some embodiments, the drone 10 recognizes that the parachute 22 has separated from the sky diver 40 (e.g. through images from the drone camera 11). After recognizing such, if the drone 10 has sufficient battery power, the drone 10 tracks the parachute 22 that is now drifting freely with the wind and the drone 10 records a location at which the parachute 22 comes to rest. In some embodiments, the location at which the parachute 22 came to rest is forwarded to the device 30 for display, for example, as a pushpin on a map.

Figure 7:
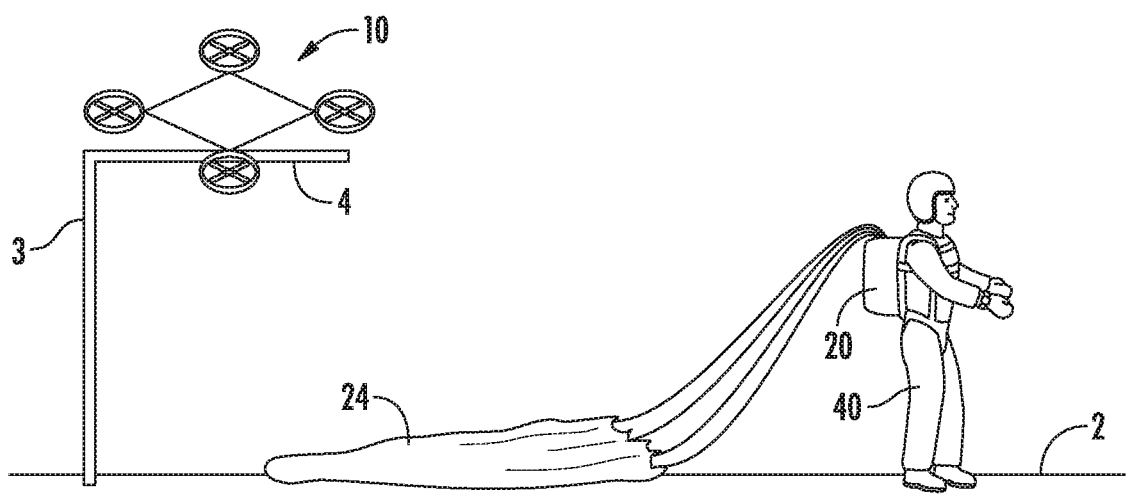
FIG. 7 illustrates the system for unassisted sky diving after return to the ground.

Referring to FIG. 7, the system for unassisted sky diving is shown after landing. After the jump is complete, the sky diver 40 returns to ground level altitude 2, shown standing with the parachute 24 resting on the ground. The drone 10 returns, for example, to ground level altitude 2 or lands upon the platform 3/4.

Figure 8:
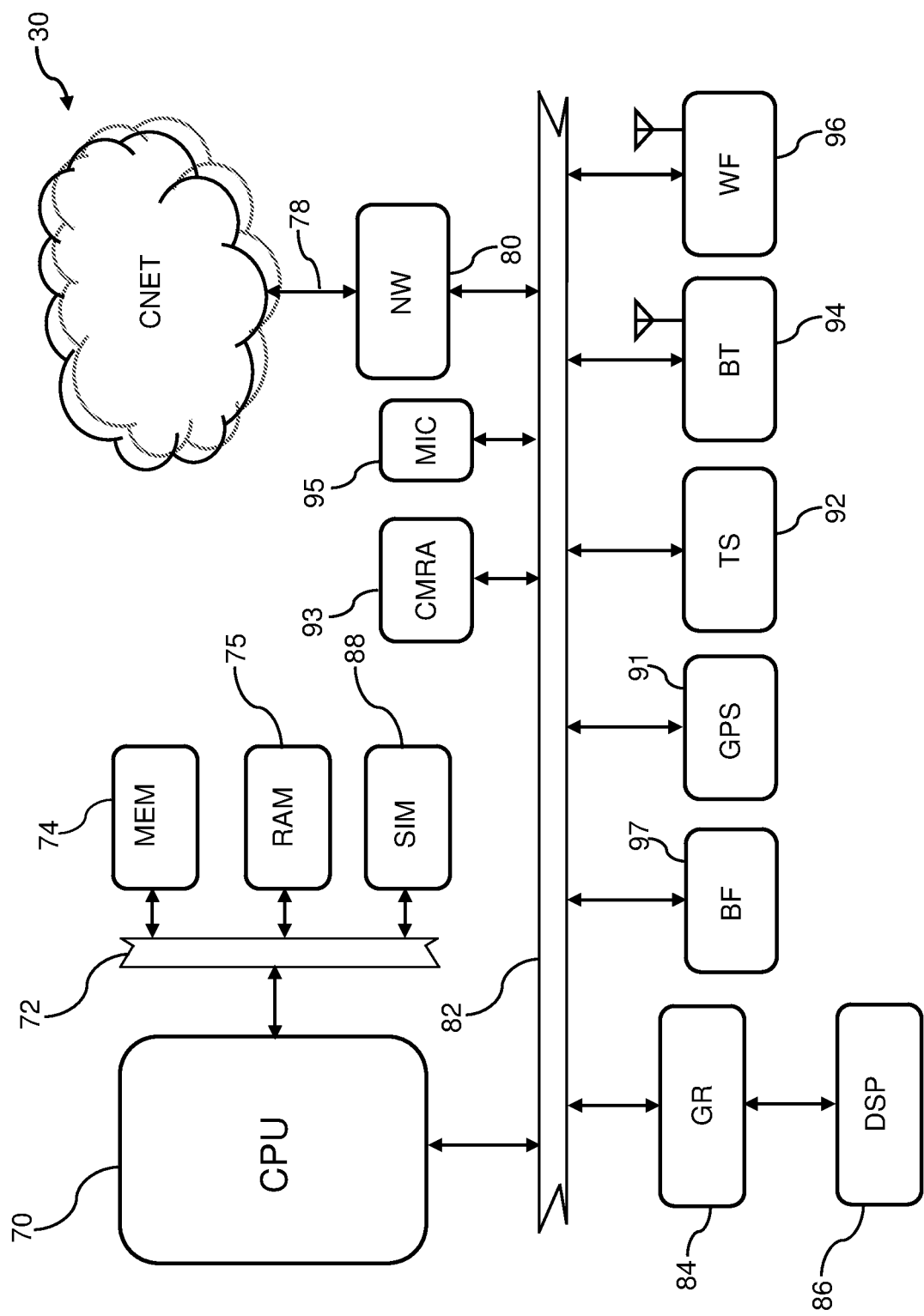
FIG. 8 illustrates a system diagram of a device used for controlling the system for unassisted sky diving.

Referring to FIG. 8, a system diagram of a device 30 used for controlling the system for unassisted sky diving is shown. Although any end-user device is anticipated, for clarity purposes, a smartwatch will be used for the device 30 in the remainder of the description.

The system for unassisted sky diving is described using a device 30 (e.g., smartwatch) that is processor-based for providing the login and user interfaces necessary for controlling the drone 10. The present invention is in no way limited to using a smartwatch and any similar device is anticipated (e.g., cellular phone, portable digital assistant, tablet, notebook, etc.).

The example device 30 represents a typical device used for controlling the drone 10 of the system for unassisted sky diving. This exemplary device 30 is shown in one form with a sample set of features. Different architectures are known that accomplish similar results in a similar fashion and the present invention is not limited in any way to any particular device 30 system architecture or implementation. In this exemplary device 30, a processor 70 executes or runs programs in a random-access memory 75. The programs are generally stored within a persistent memory 74 and loaded into the random-access memory 75 when needed. Also accessible by the processor 70 is a SIM (subscriber information module) card 88 having a subscriber identification and often persistent storage. The processor 70 is any processor, typically a processor designed for phones. The persistent memory 74, random-access memory 75, and SIM card are connected to the processor by, for example, a memory bus 72. The random-access memory 75 is any memory suitable for connection and operation with the selected processor 70, such as SRAM, DRAM, SDRAM, RDRAM, DDR, DDR-2, etc. The persistent memory 74 is any type, configuration, capacity of memory suitable for persistently storing data, for example, flash memory, read only memory, battery-backed memory, etc. In some exemplary devices 30, the persistent memory 74 is removable, in the form of a memory card of appropriate format such as SD (secure digital) cards, micro SD cards, compact flash, etc.

Also connected to the processor 70 is a system bus 82 for connecting to peripheral subsystems such as a cellular network interface 80, a graphics adapter 84 and a touch screen interface 92. The graphics adapter 84 receives commands from the processor 70 and controls what is depicted on the display 86. The touch screen interface 92 provides navigation and selection features.

In general, some portion of the persistent memory 74 and/or the SIM card 88 is used to store programs, executable code, and data, etc. In some embodiments, other data is stored in the persistent memory 74 such as audio files, video files, text messages, etc.

The peripherals are examples and other devices are known in the industry such as Global Positioning Subsystem 91, speakers, microphones, USB interfaces, camera 93, microphone 95, Bluetooth transceiver 94, Wi-Fi radio frequency transceiver 96, image sensors, temperature sensors, etc., the details of which are not shown for brevity and clarity reasons.

The cellular network interface 80 connects the device 30 to the cellular network through any cellular band and cellular protocol such as GSM, TDMA, LTE, etc., through a wireless medium 78. There is no limitation on the type of cellular connection used. The cellular network interface 80 provides voice call, data, and messaging services to the device 30 through the cellular network.

For local communications, for example communications with the drone 10, the device 30 includes radio frequency transceivers such as a Bluetooth transceiver 94, a Wi-Fi radio frequency transceiver 96, or both. Such features of devices 30 provide data communications between the devices 30 and the drone 10.

In some embodiments, the device 30 includes one or more sensors 97 that measure biological factors of the sky diver 40. Such are, for example, heart rate sensors, breathing sensors, pulse sensors, temperature sensors, infrared sensors, etc. When present, should the device 30 detect a suspicious stat of the sky diver's body, the device 30 transmits a signal to the drone 10 to abort the mission and return to ground. This is used, for example, in cases where the sky diver 40 passes out or has a heart problem.

Figure 9:
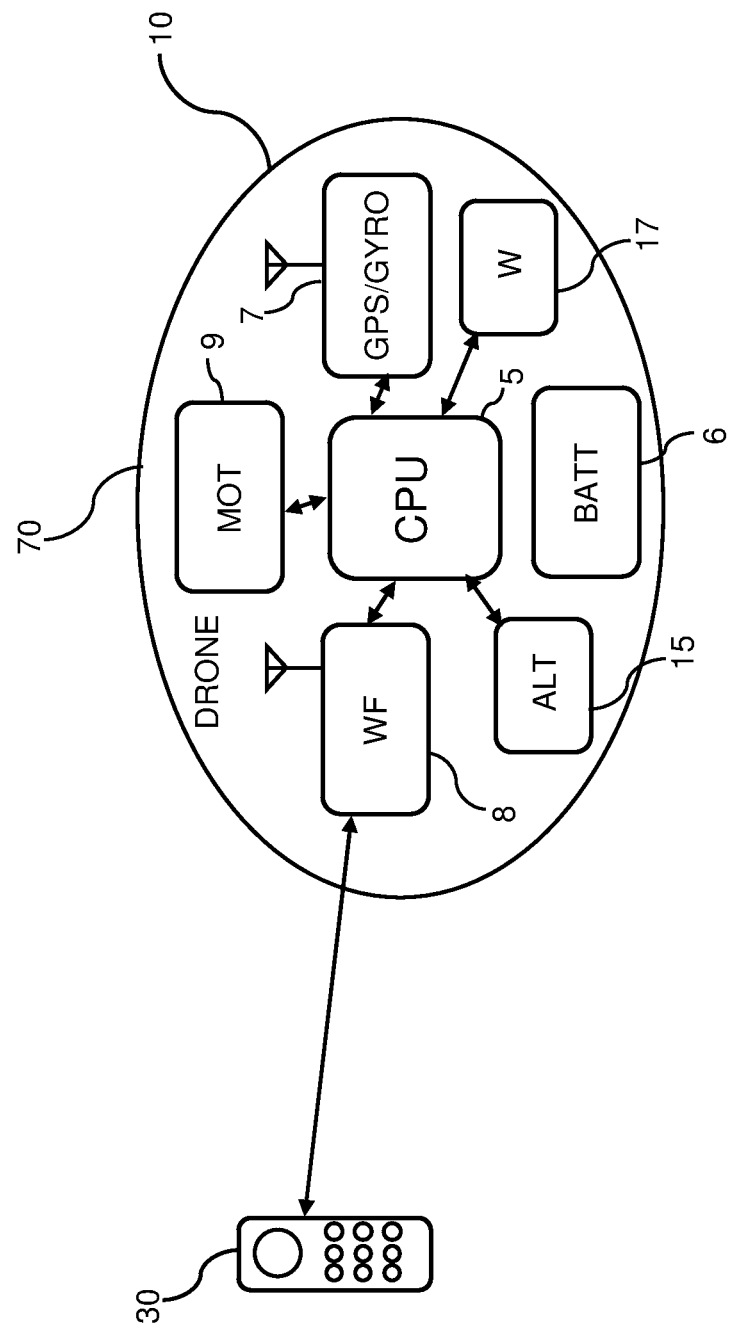
FIG. 9 illustrates interconnection of the system for unassisted sky diving and device used for controlling.

Referring to FIG. 9, an interconnection of the system for unassisted sky diving between the device 30 used for controlling the drone 10 and the drone 10 is shown. Although any wireless communication mechanism is anticipated, in this example, the device 30 communicates to the drone 10 using a wireless transmission protocol 802.11, known as Wi-Fi. The Wi-Fi radio frequency transceiver 96 of the device 30 communicates with a second Wi-Fi radio frequency transceiver 8 of the drone 10. The second Wi-Fi radio frequency transceiver 8 of the drone 10 is interfaced to a processor 5 within the drone 10. The processor controls the motors 9 of the drone 10, and hence blades that are operatively coupled to the motors. A Global Positioning Receiver and Gyroscope 7 within the drone 10 conveys the location and pitch of the drone 10 to the processor 5 and the processor controls individual motors 9 to adjust the location, altitude, and height of the drone 10, and therefore, the sky diver 40 when attached. In some embodiments, an altimeter 15 conveys an altitude of the drone 10 to the processor 5 and the processor reads the altimeter 15 at ground level altitude 2 and during operation to determine a safe altitude (minimum jump altitude) for release of the sky diver 40. Note, other components of drones 10 are well known and not shown for clarity.

The battery 6 is a very important part of the drone 10. Premature failure/discharge of the battery 6 is dangerous as there is a minimum altitude needed for safe sky diving. If there is not sufficient battery power in the battery 6 to reach this minimum altitude, it is possible that the drone 10 will fail before this minimum altitude and the sky diver 40 will not have sufficient time to release the parachute 24 from the parachute pack 20. For this reason, the processor 5 monitors the battery 6 and calculates the amount of available lifting power based upon either a recorded weight or a measured weight of the sky diver 40. Therefore, in some embodiments, the drone 10 includes a device that measures weight 17 (e.g. weight sensor, strain gauge) asserted on the cable 12 and before take-off, the weight of the sky diver 40 is measured to assure sufficient lift to achieve the minimum altitude.

Figure 10:
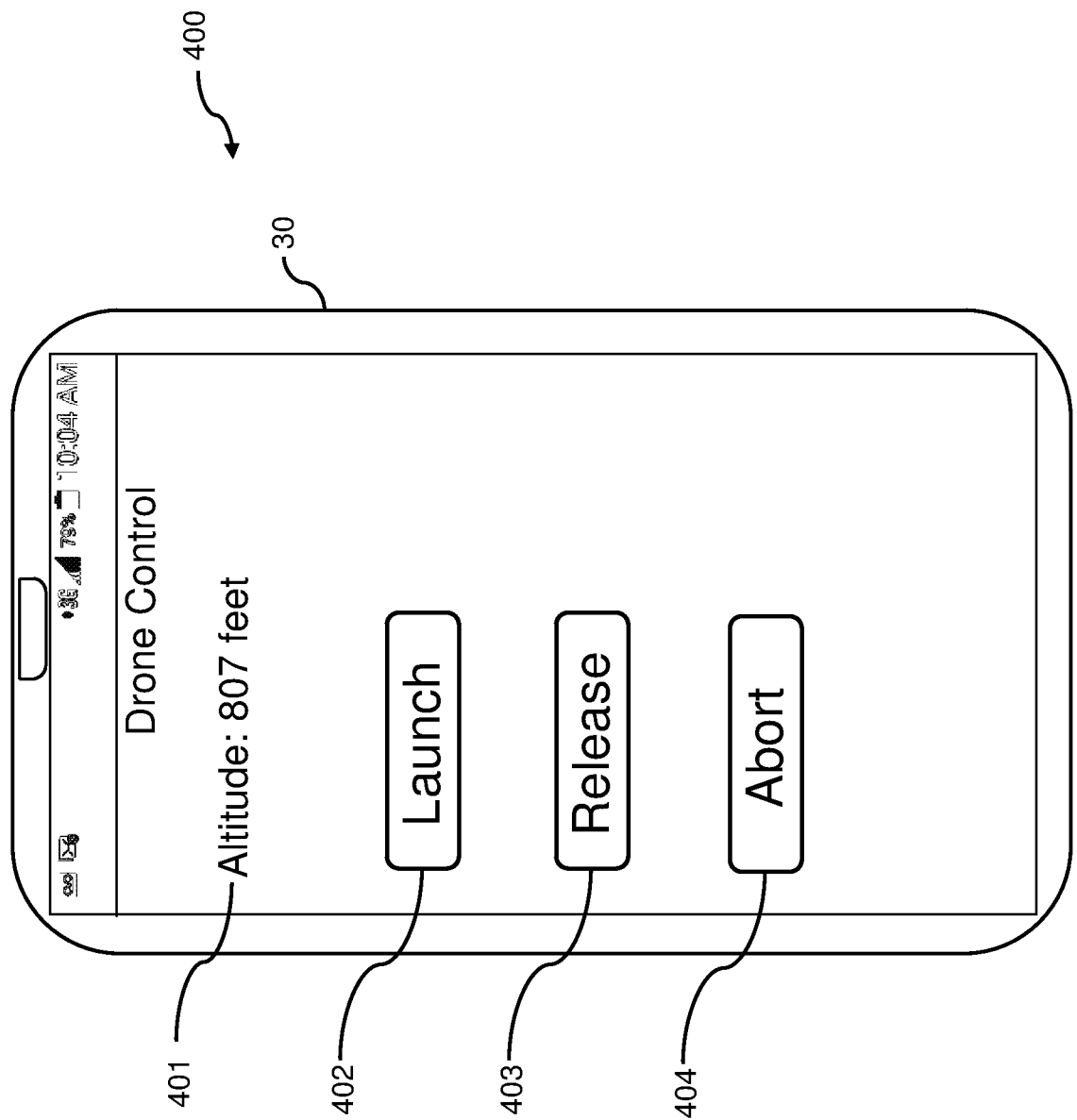
FIG. 10 illustrates an exemplary user interface of the system for unassisted sky diving.

Referring to FIG. 10, an exemplary user interface 400 of the system for unassisted sky diving is shown. In this exemplary user interface 400, the altitude 401 of the drone 10 is displayed (e.g. 807 feet). Note, in some embodiments, the altitude of the drone 10 is measured when the drone 10 is at ground level altitude 2 and the altitude 401 is displayed as a distance from ground level altitude 2 (e.g. 807 feet above ground level altitude 2), as this is important to the sky diver 40.

Other features shown in the exemplary user interface 400 include a launch icon 402, a release icon 403, and an abort icon 404. To initiate the jump, the sky diver 40 invokes the launch icon 402. If the drone 10, measuring available power in the battery 6, determines there is insufficient available power to reach the minimum jump altitude, the launch icon 402 is either not functional or activation results in an error message.

Once launched, in embodiments in which the connector 14 is electromechanical, activation of the release icon 403 activates the connector 14 to release the sky diver 40, again, only if the sky diver 40 is at the minimum jump altitude.

While the sky diver 40 is connected to the drone 10, the sky diver 40 can activate the abort icon 404 to abort the mission and return to the ground. In this, if the processor 5 determines that there is insufficient power remaining in the battery 6 for a safe return to the ground, the processor 5 inhibits the abort icon 404 and the drone 10, therefore, forces the sky diver 40 to release and make the jump, as it is dangerous to attempt to abort and return to the ground when it is likely that the drone 10 will run out of power at a dangerous altitude.

Figure 11:
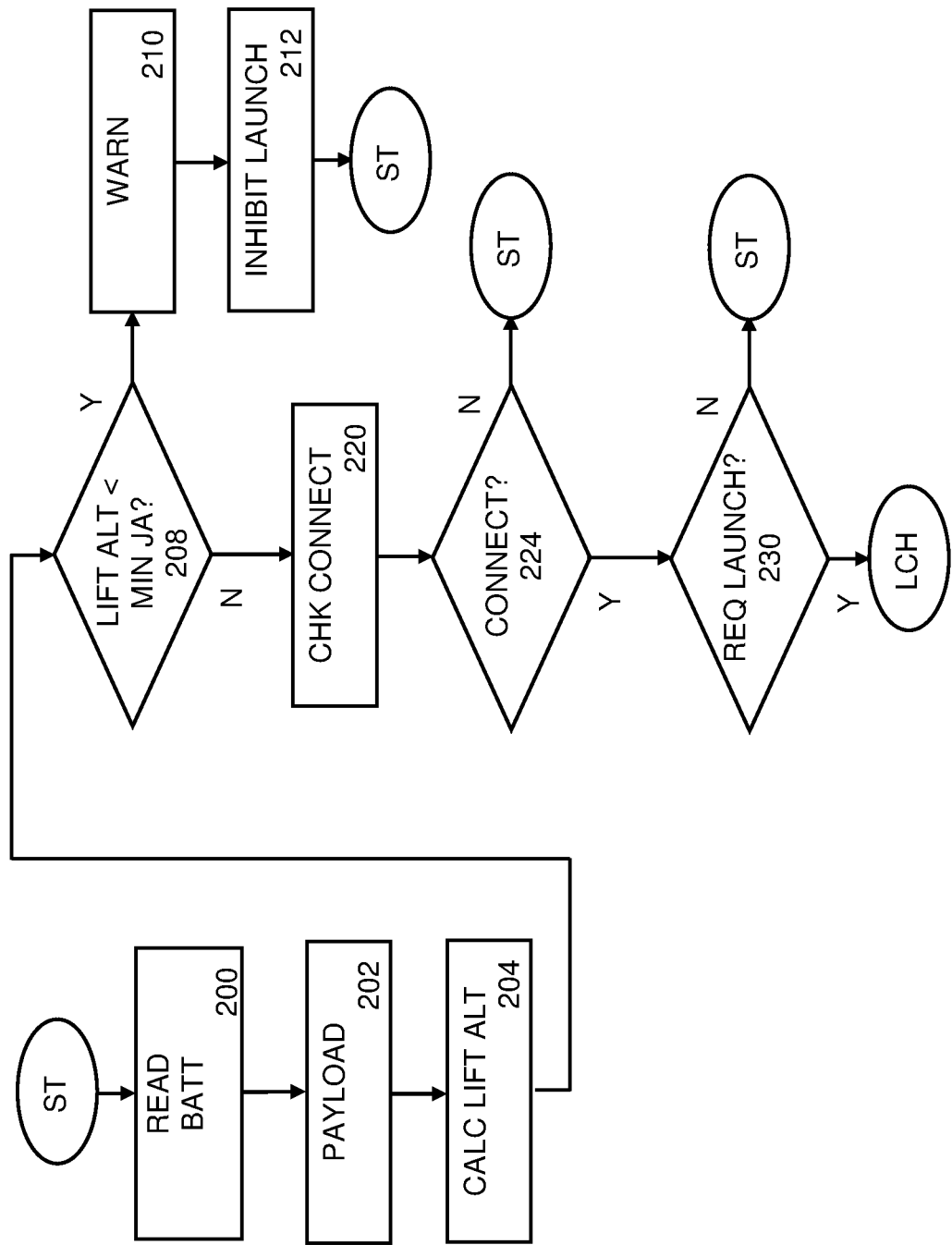
FIGS. 11, 12, and 13 illustrate an exemplary program flow of the system for unassisted sky diving.
Figure 12:
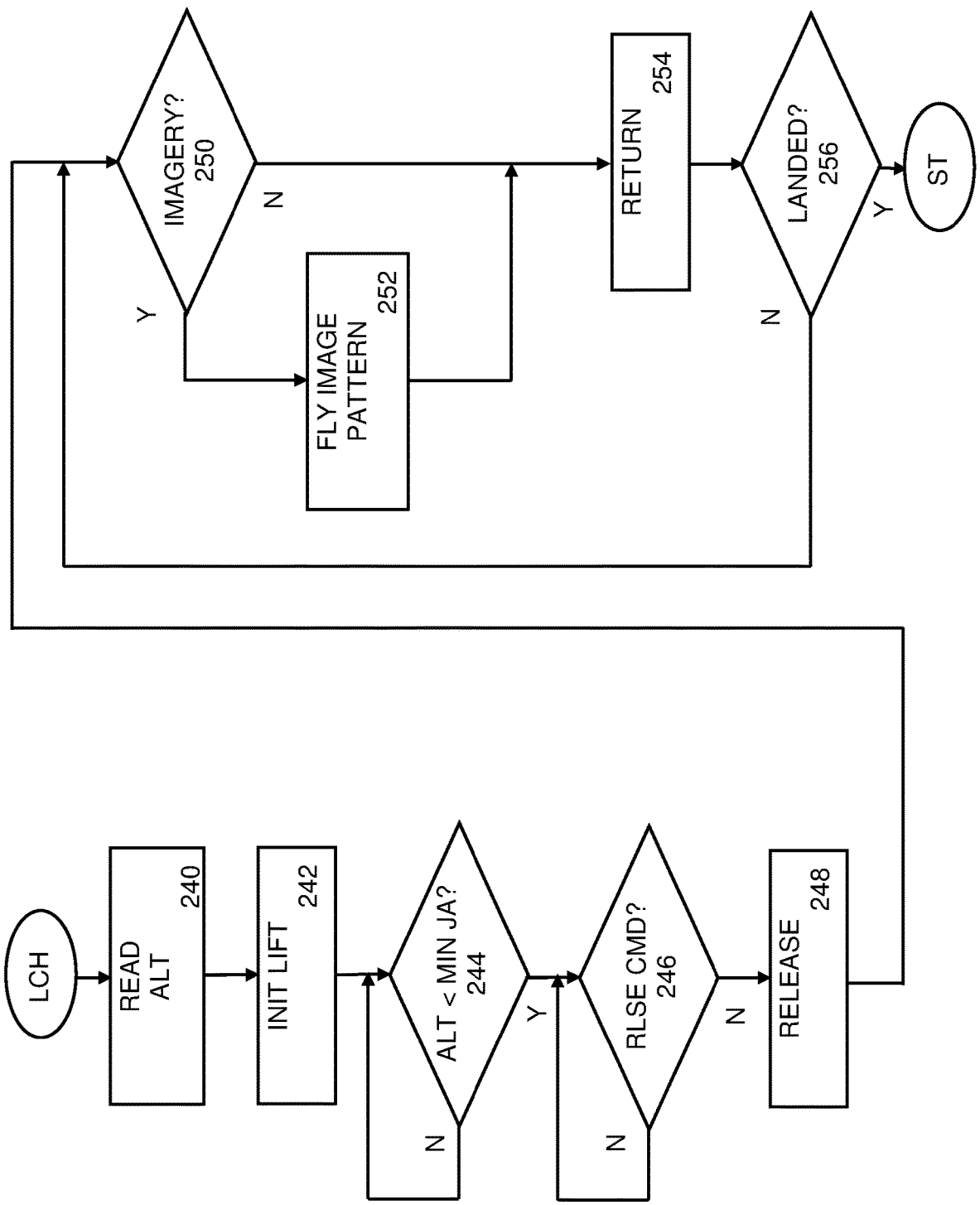
Figure 13:
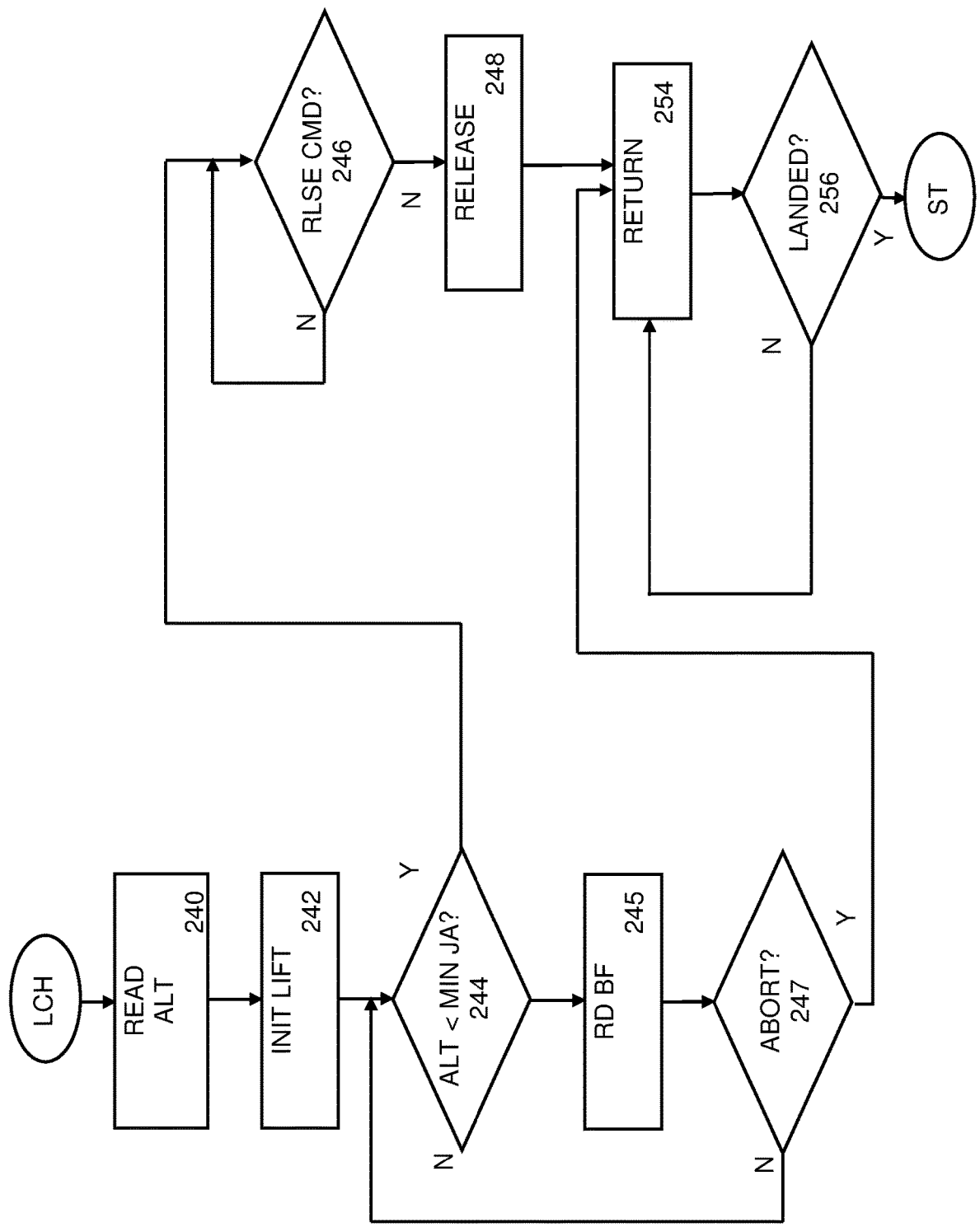

Referring to FIGS. 11, 12, and 13, an exemplary program flow of the system for unassisted sky diving. In FIG. 11, the processor 5 reads 200 the battery 6 to find out how much power (charge) is available in the battery. Then the processor 5 determines 202 the payload, or the weight of the sky diver 40. In some embodiments, the processor 5 determines 202 the payload, or the weight of the sky diver 40 by reading the device that measures weight 17 while in other embodiments, the processor 5 determines 202 the payload, or the weight of the sky diver 40 by reading a stored parameter that was previously set to the weight of the sky diver 40 (including parachute pack 20).

The processor 5 calculates 204 a lift altitude using the payload and available power and then compares 208 the lift altitude to a minimum jump altitude (MIN JA). If the lift altitude is less than the minimum jump altitude (MIN JA), a warning is made 210 and the launch is inhibited 212. For example, the launch icon 402 is inhibited and/or an error light on the drone 10 is illuminated. This feature prevents the drone 10 and sky diver 40 from launching when the drone 10 will not be able to attain the minimum jump altitude (e.g. at least 1000 feet above ground level altitude 2).

If the lift altitude is greater than or equal to the minimum jump altitude (MIN JA), a test 224 is made to assure that the connector 14 is engaged (e.g. when the connector 14 is electromechanical). If the connector 14 is not engaged, the above is repeated and no launch is made. If the connector 14 is engaged, a test 230 is made to determine if the sky diver 40 has requested a launch (e.g. activated the launch icon 402). If the sky diver 40 has not requested a launch, the above repeats. If the sky diver 40 has requested a launch, the launch flow of FIG. 12 begins.

In FIG. 12, the launch sequence is shown. First the current altitude is read 240 (e.g. the altitude at ground level), then lift in initiated 242. The altitude is read and lift continues 244 if not yet at the minimum jump altitude (MJA).

Once above at the minimum jump altitude (MJA), the processor 5 waits for the release command 246 from the device 30 (e.g. release icon 403 activated) and initiates release 248.

If the drone 10 is programmed for imagery 250, the drone flies a pattern 252 around the sky diver 40 taking images with the drone camera 11. Note that by use of the drone camera 11 and/or other sensing mechanisms, the drone 10 files the pattern 252 while avoiding contact with the sky diver 40 and, after deployment, the parachute 24 and parachute ropes while continuing the return 254 to the location of takeoff. A test 256 is made to determine if the drone 10 has landed yet and, if not, the above steps repeat until the drone 10 lands.

In FIG. 13, a slightly different launch sequence is shown including a safety feature that detects if the sky diver has passed out. First the current altitude is read 240 (e.g. the altitude at ground level and, then lift in initiated 242. The altitude is read and lift continues 244 if not yet at the minimum jump altitude (MJA). Biological functions of the sky diver 40 are read 245. These biological functions indicate the health of the sky diver, for example, heart rate, temperature, and breathing. If the biological functions indicate there is a problem for the sky diver 40 (e.g. the sky diver 40 fainted) or if a manual abort is received, the drone 10 initiates return 254 to the location of takeoff until it has landed. In some embodiments, the device 30 also signals for help (e.g. calling a local dispatcher or 911).

Once above at the minimum jump altitude (MJA), the processor 5 waits for the release command 246 from the device 30 (e.g. release icon 403 activated) and initiates release 248. Note that, in some embodiments, if the processor 5 detects a low power level of the battery 6, the processor 5 alerts the sky diver 40 through the device 30 (e.g. display color, sound) and, eventually automatically initiates release 248 even though no release command 246 was received. This is important, in that, if there is a low power level, the drone 10 will not be able to land nor support the sky diver 40 any longer. In some embodiments, the sky diver 40 sets an auto-release altitude and once the drone 10 achieves the auto-release altitude, the drone 10 initiates the release 248.

For clarity, the image taking of FIG. 12 is not shown in FIG. 13. After release, the sky diver 40 free falls until the sky diver 40 releases/opens the parachute 24 while the drone 10 is continuing the return 254 to the location of takeoff. A test 256 is made to determine if the drone 10 has landed yet and, if not, the above steps repeat until the drone 10 lands.

Equivalent elements can be substituted for the ones set forth above such that they perform in substantially the same manner in substantially the same way for achieving substantially the same result.

It is believed that the system and method as described and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A system for unassisted sky diving, the system comprising:
    a drone;
    a parachute pack, the parachute pack containing a parachute and the parachute pack having a harness for attaching to a sky diver the parachute pack connected to the drone by one or more cables or ropes;
    a device for controlling the drone;
    means for initiating a launch of the drone by the sky diver; and
    means for releasing the parachute pack from the drone;
    whereas the sky diver is held in an upright position through the one or more ropes or cables by the drone until the means for releasing the parachute pack is activated.

2. The system of claim 1, wherein means for releasing comprises an electromagnet release mechanism, separation by the electromagnet release mechanism is initiated by the drone by controlling a current flow through the electromagnet release mechanism.

3. The system of claim 2, wherein the electromagnet release mechanism is inhibited from releasing the parachute pack while the drone is less than a minimum jump altitude above a ground level altitude.

4. The system of claim 1, wherein the means for initiating the launch is inhibited when the drone has insufficient power stored in a battery of the drone to attain a minimum jump altitude given a mass of the drone, a mass of the parachute pack, and a mass of the skydiver.

5. The system of claim 1, wherein the device is a smartphone.

6. The system of claim 1, wherein the device is a smartwatch.

7. A method of unassisted sky diving comprising:
    donning a parachute pack by a sky diver;
    attaching the parachute pack to a drone;
    the sky diver standing in an upright position;
    controlling the drone to launch into air using a device held or worn by the sky diver, the drone carrying the sky diver; and
    releasing the parachute pack and the sky diver from the drone.

8. The method of claim 7, wherein the step of releasing is performed by a connector that is electromechanically operated by the drone, the connector interfaced between the drone and the parachute.

9. The method of claim 7, wherein the step of controlling the drone to launch further comprises a step of measuring an amount of power stored in a battery of the drone and if the amount of power is less than that required to lift the drone, parachute pack, and sky diver to a minimum jump altitude above ground level altitude, preventing the drone from launching.

10. The method of claim 9, wherein the minimum jump altitude is 1000 feet above ground level altitude.

11. The method of claim 7, wherein the step of releasing the parachute pack and the sky diver further comprises a step of measuring an altitude above ground level altitude and if altitude above ground level altitude is less than a minimum jump altitude above the ground level altitude, preventing the step of releasing.

12. The method of claim 7, wherein the step of releasing the parachute pack and the sky diver is performed by the drone using a connector that is electromechanically controlled; the connector is interfaced between the drone and the parachute pack.

13. The method of claim 7, wherein the step of controlling the drone includes sending a radio frequency signal from the device.

14. The method of claim 7, wherein the drone comprises a drone camera and after the step of releasing the parachute pack and the sky diver from the drone, the steps of:
    the drone capturing and processing images of the sky diver during a descent of the sky diver;
    the drone descending, following the sky diver;
    the drone, recognizing that a parachute of the sky diver separates from the sky diver, the drone tracking and following the parachute until the parachute comes to rest; and
    the drone recording a location at which the parachute came to rest.

15. A system for unassisted sky diving, the system comprising:
    a drone having means for attaching and releasing to a parachute pack, the drone having a battery, a radio frequency transceiver, motors with blades operatively attached to each of the motors, means for determining location, means for measuring an altitude, and a processor operatively coupled to the radio frequency transceiver, the motors, the means for determining the location, the means for measuring the altitude and the battery; the parachute pack for containing a parachute, the parachute pack having a harness for holding a sky diver in an upright position while connected to the drone;
    a device for controlling the drone, the device having a second radio frequency transceiver for communicating with the radio frequency transceiver of the drone;
    means for sending a first signal from the second radio frequency transceiver to the radio frequency transceiver of the drone initiated by the sky diver, the first signal signaling the processor to read a ground level altitude from the means for measuring the altitude then to enable the motors to lift the drone into air, carrying the sky diver; and
    means for sending a second signal from the second radio frequency transceiver to the radio frequency transceiver of the drone initiated by the sky diver, the second signal signaling the processor to release the parachute pack and the sky diver from the drone at the means for attaching and releasing.

16. The system of claim 15, wherein before the processor enables the motors to lift the drone into air, the processor reads a power level from the battery and the processor calculates a maximum attainable altitude based upon the power level and a combined weight of the drone, parachute pack, and sky diver; and if the maximum attainable altitude is less than a minimum jump altitude above the ground level altitude, the processor does not enable the motors to lift the drone into the air.

17. The system of claim 16, wherein the processor calculates the maximum attainable altitude based upon the power level and the combined weight of the drone, the parachute pack, and the sky diver using means for measuring weight, wherein the means for measuring weight is interfaced to the means for attaching and releasing.

18. The system of claim 16, wherein the processor calculates the maximum attainable altitude based upon the power level and a stored parameter, the stored parameter indicating the combined weight of the drone, the parachute pack, and the sky diver.

19. The system of claim 15, wherein before the processor releases the parachute pack and the sky diver from the drone, the processor reads a current altitude from the means for measuring the altitude and if the current altitude is less than a minimum jump altitude above the ground level altitude, the processor does not release the parachute pack and the sky diver from the drone.

20. The system of claim 15, wherein after the processor releases the parachute pack and the sky diver, the processor controls the drone to hover around the sky diver and to take pictures or video of the sky diver.

* * * * *